United States Patent
Doyle et al.

(10) Patent No.: US 6,198,421 B1
(45) Date of Patent: Mar. 6, 2001

(54) NEURAL-FLASH ANALOG-TO-DIGITAL CONVERTER USING WEIGHTED CURRENT SIMILATION

(75) Inventors: James T. Doyle, Chandler, AZ (US); Carl F. Liepold, Mesa, CA (US)

(73) Assignee: Intle Corporation, Santa Clara, CA (US)

( * ) Notice: Subject to any disclaimer, the term of this patent is extended or adjusted under 35 U.S.C. 154(b) by 0 days.

(21) Appl. No.: 09/259,650

(22) Filed: Feb. 26, 1999

(51) Int. Cl.$^7$ .................................................... H03M 1/36
(52) U.S. Cl. ............................................. 341/159; 341/136
(58) Field of Search ................................... 341/133, 135, 341/136, 158, 159

(56) References Cited

U.S. PATENT DOCUMENTS

| | | | |
|---|---|---|---|
| 4,647,904 | * 3/1987 | Kuklewicz | 341/135 |
| 4,965,579 | * 10/1990 | Liu et al. | 341/159 |
| 5,675,341 | * 10/1997 | Vallancourt et al. | 341/158 |
| 5,815,107 | * 9/1998 | Frankeny et al. | 341/159 |

* cited by examiner

Primary Examiner—Howard L. Williams
(74) Attorney, Agent, or Firm—Blakely, Sokoloff, Taylor & Zafman LLP

(57) ABSTRACT

One embodiment of the present invention provides a flash analog-to-digital converter (ADC) based on a feedforward perceptron. The ADC includes a plurality of N stages to provide N digital signals. The plurality of N stages includes a first stage to provide a sum of an input current, related to a voltage to be converted, and of a reference current. The first stage provides a first digital signal in one of first and second states if the sum has one of first and second signs, respectively. The plurality of N stages further includes i stages, with i=2 ... N. Each stage i includes an output circuit and $2^{(i-2)}$ sub-stages coupled to the output circuit. Each sub-stage includes an input and a hidden circuit coupled therebetween. The input circuit is configured to provide a first sum of the input current and of a first reference current. Each hidden circuit provides to the output circuit a second reference current when the first sum has a first sign. The output circuit generates an $i^{th}$ digital signal in one of a first and second states when a second sum of the input current and of the second reference current has one of first and second signs respectively.

24 Claims, 8 Drawing Sheets

| PARTITIONS OF INTERVAL [0,1] | BINARY WORDS $V_1, V_2, V_3, V_4$ | | | |
|---|---|---|---|---|
| $0, \frac{1}{16}$ | 0 | 0 | 0 | 0 |
| $\frac{1}{16}, \frac{2}{16}$ | 0 | 0 | 0 | 1 |
| $\frac{2}{16}, \frac{3}{16}$ | 0 | 0 | 1 | 1 |
| $\frac{3}{16}, \frac{4}{16}$ | 0 | 0 | 1 | 0 |
| $\frac{4}{16}, \frac{5}{16}$ | 0 | 1 | 1 | 0 |
| $\frac{5}{16}, \frac{6}{16}$ | 0 | 1 | 1 | 1 |
| $\frac{6}{16}, \frac{7}{16}$ | 0 | 1 | 0 | 1 |
| $\frac{7}{16}, \frac{8}{16}$ | 0 | 1 | 0 | 0 |
| $\frac{8}{16}, \frac{9}{16}$ | 1 | 1 | 0 | 0 |
| $\frac{9}{16}, \frac{10}{16}$ | 1 | 1 | 0 | 1 |
| $\frac{10}{16}, \frac{11}{16}$ | 1 | 1 | 1 | 1 |
| $\frac{11}{16}, \frac{12}{16}$ | 1 | 1 | 1 | 0 |
| $\frac{12}{16}, \frac{13}{16}$ | 1 | 0 | 1 | 0 |
| $\frac{13}{16}, \frac{14}{16}$ | 1 | 0 | 1 | 1 |
| $\frac{14}{16}, \frac{15}{16}$ | 1 | 0 | 0 | 1 |
| $\frac{15}{16}, \frac{16}{16}$ | 1 | 0 | 0 | 0 |
| $\frac{16}{16}, \frac{17}{16}$ | 1 | 1 | 1 | 1 |

400

NEURAL-FLASH ANALOG-TO-DIGITAL CONVERTER USING WEIGHTED CURRENT SIMILATION

BACKGROUND (1) Field of the Invention

This invention relates generally to the field of analog to digital converters. More particularly, this invention relates to neural analog to digital converters.

(2) Background Information

Most sensing devices such as temperature, pressure, level or flow rate sensors, yield signals which are analog in nature. Usually, these analog signals are continuous over some normally pre-determined range. These signals are transformed to digital or discrete signals to use digital computing devices to process these signals. The process of converting analog signals into corresponding digital signals is known as analog-to-digital conversion and the circuits or devices used to perform this conversion are called Analog-to-Digital Converters (ADC).

There has been increasing interest in the design of ADC based on neural networks. Artificial neural network (ANN, commonly just "neural network" or "neural net") conventionally may be viewed as a network of many very simple processors ("units" or "neurons"), each possibly having a (small amount of) local memory. The processors may be connected by unidirectional communication channels ("connections"), which carry numeric (as opposed to symbolic) data. The processors conventionally may operate only on their local data and on the inputs they receive via the connections. In this regard, a neural network may be a processing device, either an algorithm, or actual hardware, whose design may have been inspired by the design and functioning of animal brains and components thereof.

As an artificial intelligence, most conventional neural networks have some sort of "training" rule whereby the weights of connections are adjusted on the basis of presented patterns. In other words, neural networks "learn" from examples, just like children learn to recognize dogs from examples of dogs, and exhibit some structural capability for generalization.

Neurons are often elementary non-linear signal processors (in the limit they may be simple threshold discriminators). Another feature of neural networks that may distinguish them from other computing devices is a high degree of interconnection that allows a high degree of parallelism. Further, there is no idle memory containing data and programs, but rather each neuron may be pre-programmed and continuously active. The term "neural net" logically may include biological neural networks, whose elementary structures conventionally are far more complicated than the mathematical models used for neural networks.

In regards to Analog-to-Digital converters, one such neural ADC was proposed by Hopfield and Tank in the reference, "Simple Neural Optimization Networks: An A/D Converter Signal Decision Circuit and Linear Programming Circuit." *IEEE TRANS. On Circuits and Systems.* Vol. CAS-38 No. 5, May 1986, pp 533–541. This ADC is formulated as an optimization problem. Due to the recurrent structure of the ADC, the output of the ADC is plagued by a local minima problem. It is desirable to provide a neural ADC that is manufacturable, robust, process tolerant, fast responding and that consumes less power than conventional neural ADCs.

SUMMARY OF THE INVENTION

One embodiment of the present invention includes a flash analog-to-digital converter (ADC). The ADC includes a plurality of N stages to provide N digital signals. The plurality of N stages includes a first stage to provide a sum of an input current, related to a voltage to be converted, and of a reference current. The first stage provides a first digital signal in one of first and second states if the sum has one of first and second signs, respectively. The plurality of N stages further includes i stages, with i=2 . . . N. Each stage i includes an output circuit and $2^{(i-2)}$ sub-stages coupled to the output circuit. Each sub-stage includes an input and a hidden circuit coupled therebetween. The input circuit is configured to provide a first sum of the input current and of a first reference current. Each hidden circuit provides to the output circuit a second reference current when the first sum has a first sign. The output circuit generates an $i^{th}$ digital signal in one of a first and second states when a second sum of the input current and of the second reference current has one of first and second signs respectively.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

Figure 1:
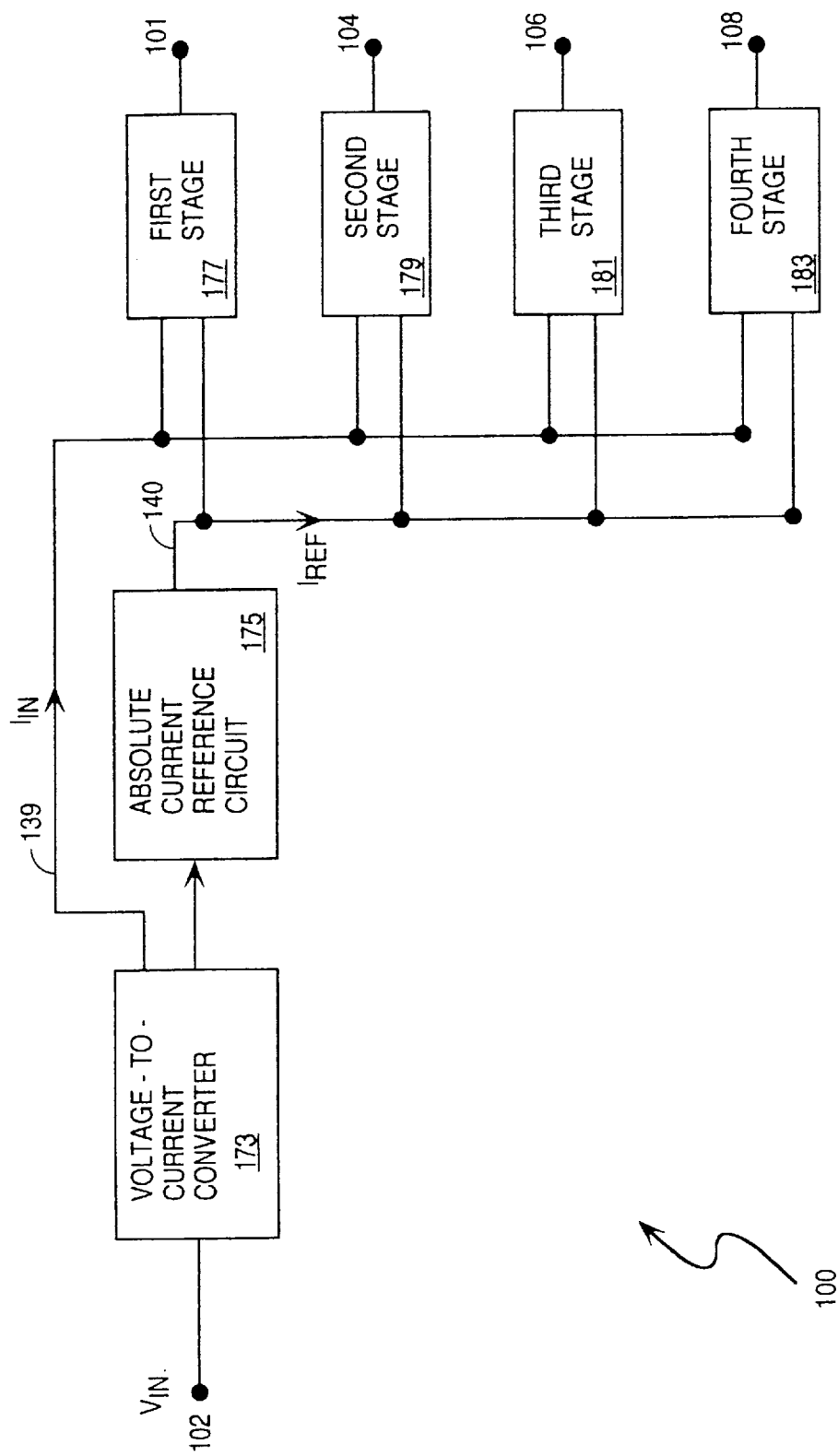
FIG. 1 is a block diagram that illustrates a high-level analog-to-digital converter (ADC) according to one embodiment of the present invention.

FIG. 1 is a high level block diagram of a flash neural analog-to-digital converter (ADC) according to one embodiment of the present invention. ADC 100 has an input 102 to which an analog signal, to be converted into a digital signal, may be coupled. In one embodiment of the present invention described herein the analog signal is an analog voltage. The analog voltage is converted, by ADC 100 into a digital voltage driven to the output ports 101, 104, 106, and 108 of the ADC. The digital voltage provided to output ports 101, 104, 106 and 108 represents the input analog voltage converted in digital form. ADC 100 of the present invention processes the analog voltage mainly by way of currents as it will be explained later in this section.

Initially, the analog voltage driven to port 102 is converted into an analog current. Then the rest of the processing performed by ADC 100 takes place in the current domain. ADC 100 includes a voltage-to-current converter circuit 173 that converts the input analog $V_{in}$ voltage into an input analog current $I_{in}$. The analog current is provided by circuit 173 via line 139 to a plurality of stages 177, 179, 181, and 183. Circuit 100 further includes an absolute current reference circuit 175 that generates an absolute current reference $I_{ref}$ to the four stages, 177, 179, 181, and 183 via line 140. Stages 177, 179, 181, and 183 receive the current $I_{in}$ generated by circuit 173 (hereinafter referred to as "input current") and the reference current generated by circuit 175. In response to these currents the plurality of stages 177, 179, 181, and 183 generate four digital bits at output ports 101, 104, 106, and 108 respectively.

Figure 2:
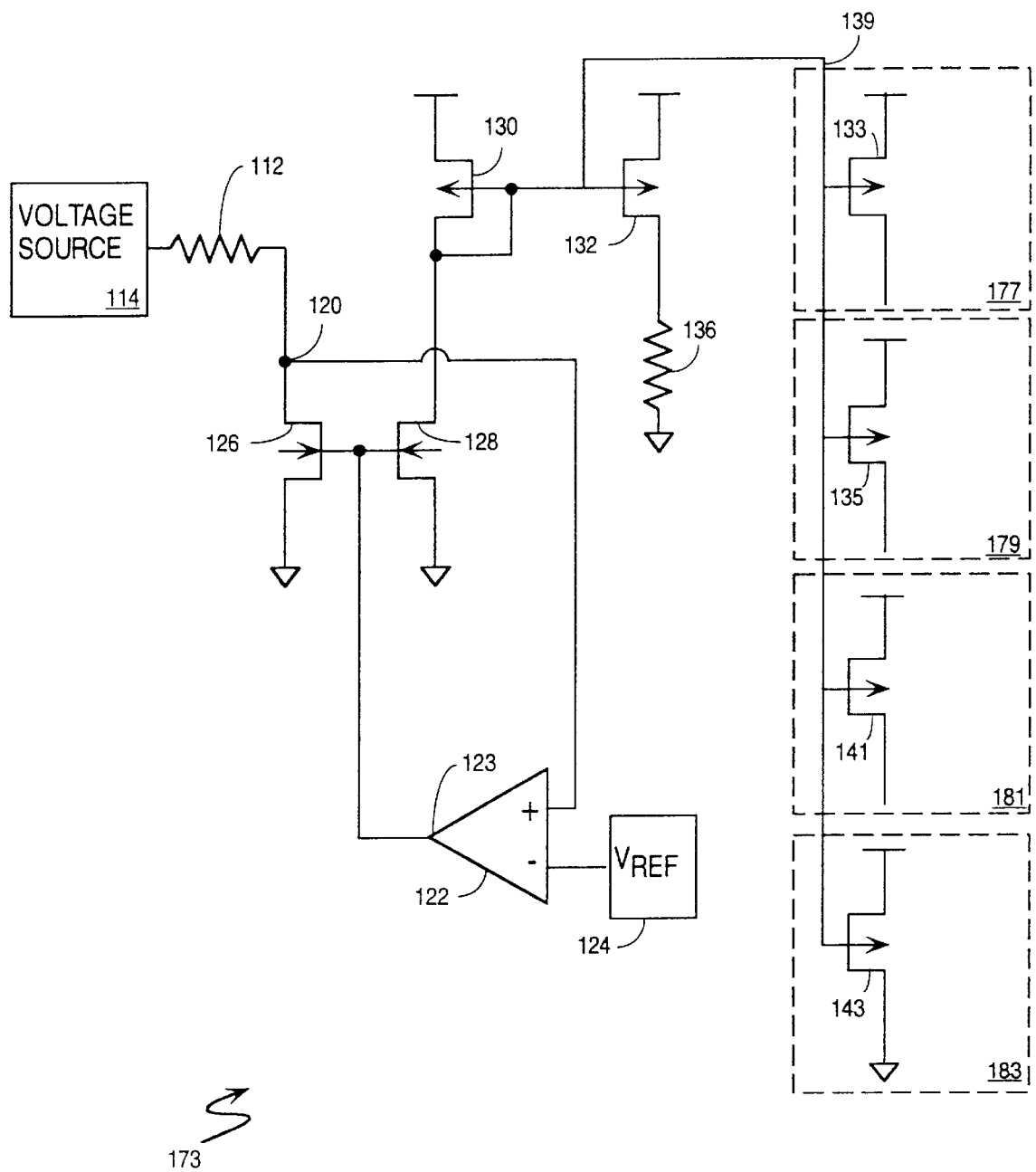
FIG. 2 is a block diagram that illustrates a voltage-to-current converter circuit 173 according to one embodiment of the present invention.

FIG. 2 is a block diagram of a voltage-to-current converter circuit 173 according to one embodiment of the present invention. Circuit 173 is utilized for converting an analog input voltage $V_{in}$ into an analog input current $I_{in}$ as the ADC according to one embodiment of the present invention relies on current steering. The analog input current is later processed by ADC 100, to obtain the digital output at the output ports of ADC 100. Circuit 173 includes first resistor 112 that may be coupled to a voltage source 114 that generates the analog voltage $V_{in}$ to be converted. Resistor 112 turns the analog voltage $V_{in}$ into an input current proportional to the analog voltage according to the well-known Ohm's law, $I=\Delta V/R$, where $\Delta V$ is the voltage difference between the voltages at the terminals of resistor R. Resistor 112 has a very accurate resistance value as this value determines the accuracy of the converted current. In the embodiment of the present invention described herein, resistor 112 may have an accuracy of 1% or better. The ADC utilizing this voltage-to-current converter circuit relies on one precision external resistor 112 for design.

Circuit 173 illustrated of FIG. 2 is designed so that node 120 is set to a fixed voltage value all the time. As node 120 is set to a fixed voltage value, the current flowing through resistor 112, that sources into node 120, remains constant at all times and is proportional to the analog input voltage produced by voltage source 114. Circuit 173 further includes an operational amplifier 122 that has a negative (−) virtual input port coupled to a voltage reference 124 that generates a fixed reference voltage. A positive (+) virtual input of the operational amplifier 124 is directly coupled to node 120.

Assume initially that the voltage at output port 123 of the operational amplifier is low. As the voltage at output port 123 voltage is low, NMOS transistors 126 and 128 are in cutoff mode. The current through transistor 126, therefore, is approximately equal to zero. In this case no current, or a very little leakage current, flows through resistor 112. Thus the voltage at node 120 is substantially equal to the input voltage $V_{in}$ that is chosen to be larger than $V_{ref}$. The operational amplifier 122, configured as shown in the Figure, operates as a comparator. When the voltage at the positive (+) virtual input of operational amplifier 122 is larger than the voltage at the negative (−) virtual input of the operational amplifier 122, a high voltage is provided at output port 123. The high voltage value at the output port 123, which is coupled to the gates of transistors 126 and 128, causes transistor 126 to conduct current. This current pulls node 120 down. The more node 120 is pulled down, the voltage at the positive and negative inputs of the operational amplifier become closer. In equilibrium, the two virtual input nodes of the operational amplifier 122 become equal in voltages, i.e., they are set to the reference voltage $V_{ref}$. Therefore, in equilibrium, node 120 is set to $V_{ref}$ and remains at this voltage value. Accordingly, the current through resistor 112, which is equal to $V_{in}-V_{ref}/R$, is directly proportional to the input voltage $V_{in}$. The input voltage $V_{in}$ is accurately converted into an input current. Note that the present invention is not limited to the embodiment where transistors 126 and 128 are NMOS transistors, being understood that other embodiments may utilize PMOS transistors coupled in such way to obtain a similar result.

Transistors 126 and 128 make up a current mirror as their gates are connected together to a same voltage value and their sources are connected to the same potential, i.e., the ground potential. Accordingly, whatever current is flowing through transistor 126 is mirrored through transistor 128 as these transistors have the same size and the gate and source voltages of these transistors are the same. Circuit 173 further includes PMOS transistors 130 and 132 that make up a second current mirror. The current flowing through both of these transistors is equal to the current that flows through the resistor 112, i.e. the input current. A resistor 136 is coupled to transistor 132 and acts as a test circuit. Resistor 136 has a value such that when the desired input current flows therethrough the voltage across this resistor is substantially equal to the input voltage. A constant current $I_{in}$ flows through line 139 to transistors 133, 135, 141 and 143 that belong to stages 177, 179, 181, and 183, respectively, of the ADC converter.

Figure 3:
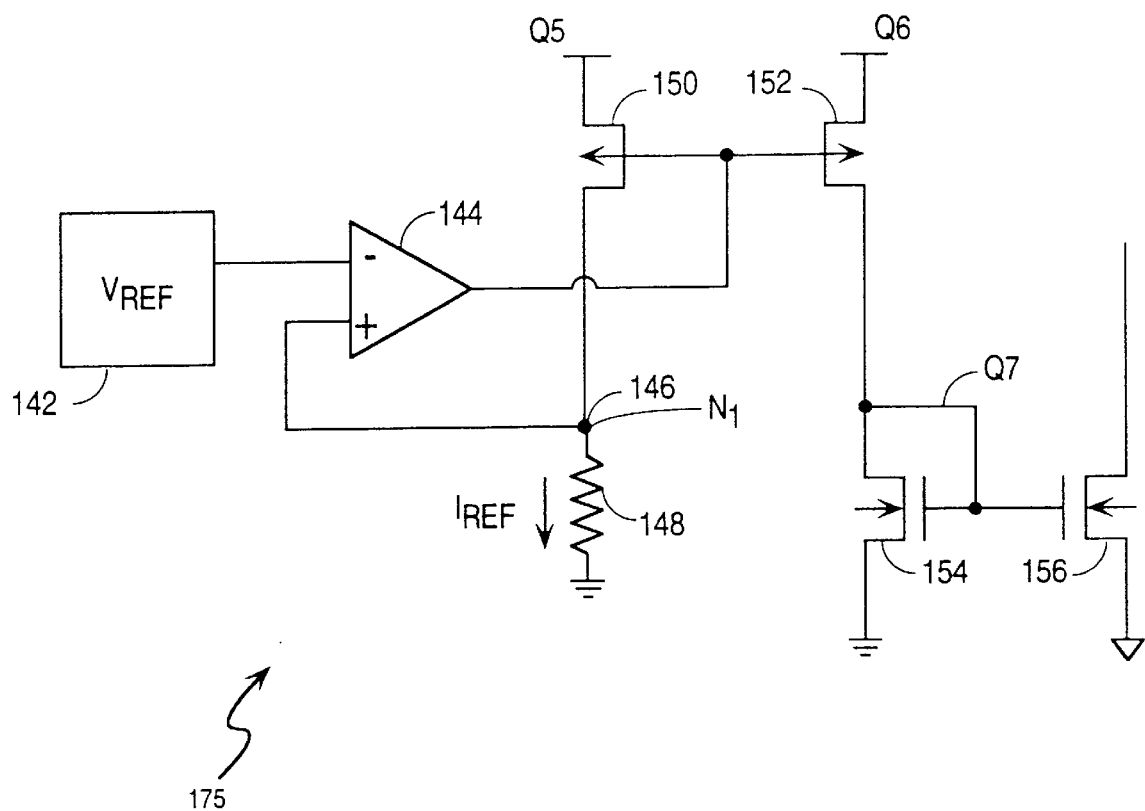
FIG. 3 is a block diagram that illustrates a reference current generator according to one embodiment of the present invention.

The ADC converter further includes reference current generator 175, that is shown in FIG. 3. The reference current generator of FIG. 3 may also be called a negative current generator because this circuit is designed to sink current from particular transistors of the stages of the ADC converter. The reference current generator 175 includes an operational amplifier 144 and voltage reference source 142 coupled to a negative virtual input of the operational amplifier 144. The positive virtual input of operational amplifier 144 is coupled to a node 146. Node 146 is coupled to a first terminal of resistor 148. Resistor 148 has a second terminal coupled to ground. Node 146 is further coupled to a current mirror made up of P-type Metal Oxide Semiconductor Field Effect Transistor (PMOSFET) transistors 150 and 152. Transistors 150 and 152 have their gates coupled to an output port of operational amplifier 144.

Assume that the output port of operational amplifier 144 is at a low voltage value when circuit 175 is turned on. The gates of PMOSFET transistors 150 and 152 are also biased at low voltage value. A low voltage at the gate of PMOSFET transistor 150 causes this transistor to conduct current and therefore to pull up the drain of that transistor which is coupled to node 146. Node 146 is pulled up until it reaches reference voltage $V_{ref}$. When node 146 reaches the voltage $V_{ref}$ it causes the operational amplifier 144 to stabilize. Both virtual input ports are set to substantially the same voltage $V_{ref}$. Because node 146 is set to fixed voltage $V_{ref}$, a fixed current $I_{ref}$ is generated through resistor 148. The fixed current $I_{ref}$ flowing through node 146 is reflected or mirrored to transistor 152 which is coupled in a current mirror configuration. Furthermore, the reference current $I_{ref}$ through transistor 152 also flows through NMOS transistor 154. Transistor 154 is coupled in a current mirror configuration to a transistor 156. Transistor 156 is placed in every stage of the plurality of stages 177, 179, 181 and 183 of the ADC converter shown in FIG. 1. Transistor 156 is therefore sinking a fixed current.

Figure 4:
FIG. 4 is a block diagram that illustrates table 400 that shows, a 4-bit digital output of the ADC converter according to one embodiment of the present invention.

FIG. 4 diagrammatically illustrates a table 400 where the 4-bit digital output $V_1$, $V_2$, $V_3$ and $V_4$, of the ADC converter is represented as a function of the input current $I_{in}$ displayed vertically in the column that has the title "Partitions of Interval 0-1". The input current shown in the first column is normalized having values that may belong in one of 16 input current intervals. For example, the input current $I_{in}$ may be in the first interval of possible values if the current $I_{in}$ has a normalized value between 0 and $1/16$. Similarly, $I_{in}$ may be in the second interval if it has a value ranging between $1/16$ and $2/16$ and so on. For values of the input current $I_{in}$ that are within 0 and $1/16$, the binary output is 0000. For an input current value in the interval $1/16$–$2/16$, the binary output is 0001. Similarly for an input value between $2/16$ and $3/16$ the output value is 0011 and so on.

Conventionally, gray code may be thought of as a binary sequence used to convert the angular, analog position of a disk to digital form. Gray code may include the property that only one bit changes between any two positions (the two positions' codes may have a Hamming distance of one). Conventionally, a radial line of sensors may read the code off the surface of the disk and, if the disk is half-way between two positions, each sensor might read its bit from both positions at once. Since only one bit differs between the two, the value read is guaranteed to be one of the two valid values rather than some third (invalid) combination (a glitch). One possible algorithm for generating a gray code sequence is to toggle bits in the order 0, 1, 0, 2, 0, 1, 0, 3, etc. Conventionally, this can also be stated as "toggle the lowest numbered bit that results in a new code".

The digital values represented by $V_1$, $V_2$, $V_3$ and $V_4$ at the output, are shown in a four bit Gray Code sequence as may be generated by toggling bits. In Gray Code, the output bit $V_1$ is 0 for the first half of the current range, i.e., 0–$8/16$ and 1 for the second half of the current range, i.e., $8/16$–$16/16$. More specifically for values of the input current ranging between 0 and $8/16$, $V_1$ is 0. For values of the input current ranging between $8/16$ and $16/16$, $V_1$ is 1. $V_2$ is 0 when the input current has values in the interval of 0–$4/16$. $V_1$ is 1 when the input current has values in the interval $4/16$–$12/16$. $V_2$ is again 0 when the input current has values between $12/16$–$16/16$.

Figure 5:
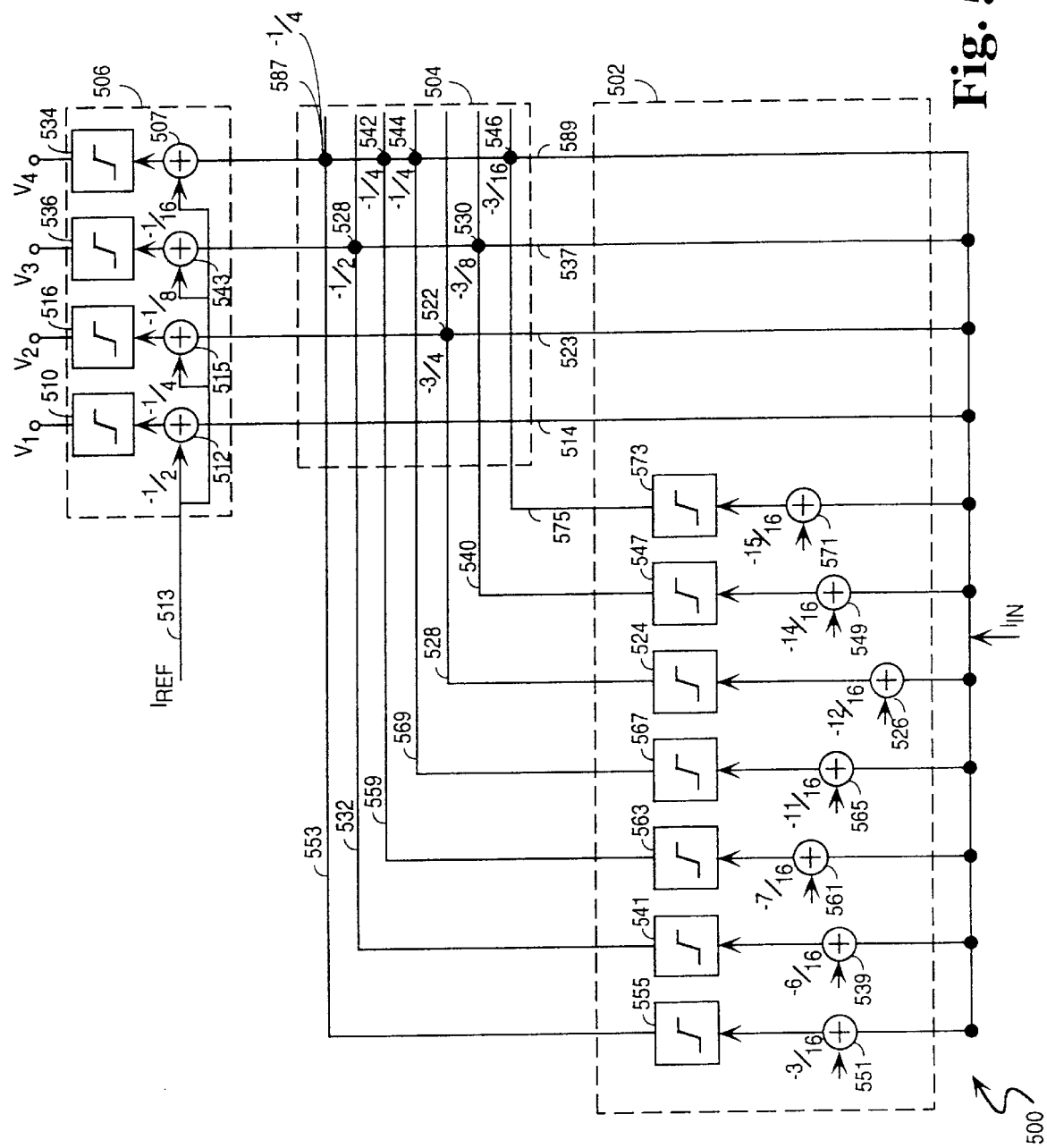
FIG. 5 is a block diagram that illustrates a perceptron implementation of the ADC according to one embodiment of the present invention.

FIG. 5 is a block diagram illustrating a feedforward perceptron implementation 500 of the ADC according to one embodiment of the present invention. A perceptron may be thought of as a network of neurons in which the output(s) of some neurons are connected through weighted connections to the input(s) of other neurons. A multilayer perceptron is a specific instance of this. Accordingly, a feedforward perceptron is a type of neural network that does not use feedback, association, or pulse excitation. Neural networks are non-linear decision making circuits which are capable of learning and adaptation. Perceptrons are multilayer (3+) structures that may include input, hidden, and output layers with weights that affect the final decision. Typically, the width of the "hidden layer" determines how efficient a perceptron design is.

The perceptron 500 includes an input layer 502 (shown in dotted line), a hidden layer 504 (shown in dotted line) and an output layer 506 (shown in dotted line). The circuit that generates bit $V_1$, is included in output layer 506. This circuit includes comparator 510 and summing device 512. Summing device 512 adds up a current that has a value related to the input current $I_{in}$, that flows via current path 514, with a current that has a value related to the reference current $I_{REF}$. The reference current has a value of $16/16$, i.e., the maximum value that the normalized current $I_{in}$ may have. In the embodiment of the present invention described herein, the value related to the reference current $I_{REF}$, driven to summing device 512, is $-1/2$. When an input current $I_{in}$, that flows through current path 514 to output circuit 506, is smaller than $1/2$, which corresponds to the value $8/16$ in the table of FIG. 4, the summing device 512 adds the value related to the reference current, $-1/2$, with the value related to the input current $I_{in}$, which is smaller than $1/2$. The result of the addition is a negative value. Comparator 510 outputs a logic "1" when the value input thereto, from the summing device 512, is a positive value. Comparator 510 outputs a "0" logic when the value driven thereto is a negative value. In this case, the summing device 512 provides a negative value to an input port of comparator 510. Therefore, comparator 510 generates a "0" logic to an output port thereof. This is consistent with the table of FIG. 4.

When the input current has a value ranging between $8/16$ and 1 i.e., $16/16$, summing device 512 adds the value related to the reference current, i.e., $-1/2$ to the value related to the input current which is larger than $1/2$. As a result, summing device 512 drives a positive value signal at the output port thereto. Comparator 510 receives the positive value from summing device 512 and in response drives a logic 1 at the output thereof. This is consistent with table 400 of FIG. 4 where $V_1$ is set to logic "1" for values of the input current $I_{in}$ that exceed $8/16$. Note that in table 400, the last 8 values of $V_1$ are 1 for values of the current larger than $8/16$.

Going next to the generation of $V_2$ one may notice from table 400 of FIG. 4 that $V_2$ transitions from 0 to 1 for values of the input current that are larger than $4/16$, i.e., $1/4$. $V_2$ transitions from 1 to 0 for values of the input current that exceed $12/16$, i.e., $3/4$. Looking at FIG. 5, when the input current $I_{in}$ is between 0 and $4/16$, i.e., lower than $1/4$, summing device 515 adds a value related to the reference current, $-1/4$, with a value related to input current $I_{in}$ which is lower than $1/4$. As a result of the addition, summing device 515 provides a negative value at an output port thereof. In response to the negative value driven to an input port thereof, comparator 516 drives a 0 logic at the output port thereof. This is consistent with table 400 of FIG. 4 where $V_2$ is 0 for values of the input current in the range of 0 to $4/16$.

When the input current $I_{in}$ has values between $4/16$ and $12/16$, $V_2$ is set to logic 1 as may be seen from table 400 of FIG. 4. When the input current exceeds $4/16$, i.e., $1/4$, summing device 515 adds the value $-1/4$ related to the reference current with a value related to the input current that exceeds $1/4$. Summing device 515, generates a positive value at an output port thereof. Therefore, comparator 516 drives a logic 1 to the output port thereof.

When the input current exceeds $12/16$, i.e., $3/4$ the hidden layer 504 starts being active. In one embodiment of the present invention described herein, the hidden layer includes a gate switch 522, represented in the Figure as a dot. Gate switch 522 is coupled in parallel with line 523 via which the input current flows to summing device 515. Gate switch 522 is coupled at a control port thereof, not shown, with comparator 524. Comparator 524 is coupled at an input thereof to summing device 526 of input layer 502. Summing device 526 receives the current $-12/16$ which is a value related to the reference current. When the input current exceeds $12/16$, summing device 526 drives a positive value at an output port thereof. This causes comparator 524 to drive a logic 1 value at an output port thereof. The logic 1 value is driven to gate switch 522 via line 528.

When the logic 1 value is provided by comparator 524 to the control gate of switch 522, switch 522 closes and causes a current that has a value of –¾ to be added to summing device 515. The "–" sign indicates that this ¾ current is sunk out of current path 524. The value "–¾" is related to the reference current as it will be explained later in this section. In this case the current summed up at the summing device 515 is –¼–¾+$I_n$. As long as the input current is lower than ¹⁶⁄₁₆, a result of the sum of currents seen at an output port of summing device 515 has a negative value. This negative value causes comparator 516 to output a "0" logic at an output port thereof. This corresponds to the "0" logic shown in table 400 of FIG. 4 for input current values ranging from ¹²⁄₁₆ to ¹⁶⁄₁₆.

Going next to the generation of the third digital bit $V_3$, the hidden layer corresponding to $V_3$ includes two switches— 528 and 530. As long as the input current is below ²⁄₁₆, these switches are turned off and $V_3$ is at 0 logic. Summing device 543 in the output layer 506 receives at an input thereof a fixed current value –⅛ related to the reference current. If the input current has a value lower than ⅛, the sign of the sum provided to the output port of summing device 534 is negative. This causes comparator 536 to output a zero logic at the output port thereof. This is consistent with table 400 of FIG. 4 where $V_3$ is 0 for values of the input current that do not exceed ²⁄₁₆, i.e., ⅛. When the input current exceeds ²⁄₁₆, summing device 543 generates at an output port thereof a positive current value which causes comparator 536 to output a logic 1 value at the output $V_3$. As long as the input current is below ⁶⁄₁₆, but greater than ²⁄₁₆, gate switch 528 of the hidden layer corresponding to $V_3$ is in an open state. Since the input current is greater than ²⁄₁₆, summing device 543 generates a positive values at its output. This causes comparator 536 to generate a logic 1 to an output port thereof.

When the input current exceeds the value ⁶⁄₁₆, the first gate switch 528 of the hidden layer corresponding to $V_3$, turns on as gate switch 528 receives a logic 1 at a control input thereof from comparator 541. Comparator 541 drives a logic 1 to an output thereof, as summing device 539 outputs a positive value to an input of comparator 541. When gate switch 528 turns on it introduces the current –½ into current path 537. Summing device 543 adds the input current value to the values –⅛ and –½. The sum of –⅛ and –½ is equal to –¹⁰⁄₁₆. As long as the input current stays below ¹⁰⁄₁₆, summing device 543 generates a negative current value at an output port thereof. This causes comparator 536 to generate a 0 logic.

However, when the input current exceeds ¹⁰⁄₁₆, summing device 543 adds the sum of –⅛ and –½ to the value of the input current which exceeds ¹⁰⁄₁₆. The sum of these values is a positive value. Such positive value, driven by summing device 543 to the input port of comparator 536 causes this comparator to generate a logic 1 to the output $V_3$. This is consistent with table 400 of FIG. 4 where $V_3$ is set to logic 1 for values of the input current exceeding ¹⁰⁄₁₆, but lower than ¹⁴⁄₁₆.

The hidden layer 504 further includes a switch 530 coupled to current path 537. This switch is coupled via a second gate line 540 to comparator 547 of the input layer. Comparator 547 is coupled to summing device 549. When the input current exceeds ¹⁴⁄₁₆, summing device 540 generates a positive value at an output port thereof. This causes comparator 547 to generate a logic 1 value to gate switch 530. The logic 1 value provided to gate switch 530 causes switch 530 to close. When switch 530 closes, a current having a value –⅜ is injected into current path 537. As a result, the current values provided to summing device 543 are:

$I_{input}$–⅜–½–⅛=$I_{input}$–1

Accordingly as long as the input current exceeds ¹⁴⁄₁₆ of the reference current but is lower than 1, $V_3$ is set to logic 0.

The fourth bit $V_4$, of the digital output is generated in ways similar to the way the other three bits $V_1$, $V_2$, and $V_3$, are generated. With respect to $V_4$, there are 4 switches in the hidden layer corresponding to $V_4$, 587, 542, 544, and 546. Each gate switch is controlled by a different comparator and summing device of the input layer. When the input current is lower than ¹⁄₁₆, summing device 507, of the output layer, adds the input current with the value –¹⁄₁₆ generating a negative value to an output thereof. This negative value causes comparator 534 to generate a "0" logic at an output thereof. This is consistent with table 4 which shows that $V_4$ is 0 for values of the current ranging between 0 and ¹⁄₁₆.

When the input current is larger than ¹⁄₁₆, but lower than ³⁄₁₆, summing device 507 generates a positive value at an output thereof due to the sum between –¹⁄₁₆ and a value larger than ¹⁄₁₆. Accordingly, comparator 534 generates a logic 1 at an output port thereof. This is consistent with table 400 of FIG. 4, where $V_4$ is "1" when the input current is larger than ¹⁄₁₆ but lower than ³⁄₁₆.

When the input current is larger than ³⁄₁₆, gate switch 587 is closed as comparator 555, in the input layer 502, generates at an output thereof a logic 1 value. The logic 1 value, at the output of comparator 555, is caused by summing device 551 which adds ³⁄₁₆ to a value larger than ³⁄₁₆. When switch 587 is closed, an additional current of ¼ is sunk out of summing device 507. As a result, ⁵⁄₁₆ is sunk out of summing device 507. Therefore, for an input current ranging between ³⁄₁₆ and ⁵⁄₁₆ summing device 507 generates a negative value at the output thereof. This values causes comparator 534 to generate a logic 0 at an output port thereof. This is consistent with the table 400 of FIG. 4 that shows that for an input current ranging between ³⁄₁₆ and ⁵⁄₁₆, $V_4$ is set to 0 logic.

However, when the input current exceeds the value ⁵⁄₁₆, the current sum at the output of summing device 507 is positive, causing $V_4$ to switch to logic 1. Specifically, $V_4$ switches to 1 for values of the current ranging between ⁵⁄₁₆ and ⁷⁄₁₆ as shown in table 400. When the input current exceeds the value ⁷⁄₁₆, summing device 561, of the input layer, generates a positive value at an output port thereof. This causes comparator 563, coupled to summing device 561, to generate a logic 1 value at an output port thereof. The logic 1 value is provided to a second gate switch 542 coupled to current path 589. This causes an additional current, having the value ¼, to be sunk out of summing device 507. The total value of the currents sunk out of summing device 507 is ⁹⁄₁₆. Therefore, for values of the input current in the range of ⁷⁄₁₆ to ⁹⁄₁₆, summing device 507 generates a negative value at an output port thereof. This causes comparator 534 to generate a zero logic value at an output port thereof. This is consistent with the table 400 of FIG. 4. However, when the input current exceeds ⁹⁄₁₆ summing device 507 generates a positive value at an output port thereof. This causes comparator 534 to generate a logic 1 value at an output port thereof.

When the input current exceeds ¹¹⁄₁₆, but is lower than ¹³⁄₁₆, summing device 565, of the input layer, generates a positive value to comparator 567. For response, comparator 567 generates a logic 1, via line 569 to a third switch 544. This causes a current having the value ¼ to be sunk out of summing device 507. The total current sunk out of summing device 507 is ¹³⁄₁₆. This value exceeds the input current which is lower than ¹³⁄₁₆. Therefore, comparator 534 outputs a 0 logic at the output $V_4$. When the input current exceeds $^{13}/_{16}$, summing device 507 generates a positive result and comparator 533 generates a logic 1 value at an output port thereof.

However, when the current exceeds the value $^{15}/_{16}$ summing device 571, of the input layer, generates a positive value which causes comparator 573 to provide at an output port thereof a logic 1 value. The logic 1 is driven to switch 546 via line 575. This causes switch 546 to close which causes an additional current that has the value of $^{3}/_{16}$ to be sunk out of summing device 507. As a result, $^{16}/_{16}$ current is sunk out of summing device 507. Since the input current is larger than $^{15}/_{16}$ but smaller than $^{16}/_{16}$, summing device 507 outputs a negative value at an output port thereof, which is driven to comparator 534. In response, comparator 534 generates a 0 logic to the output port thereof.

Note that unlike conventional ADC converters which would require $2^N$ comparators, where N is the number of output digital bits into which an analog voltage is converted, the ADC of the present invention requires less comparators. In other words, the number of comparators used by the ADC 100 may be less than $2^N$. For example, a 4-bit design of a conventional ADC converter would require $2^4$ comparators. However, there are only 11 comparators in the design according to one embodiment of the present invention illustrated in FIG. 5. Thus the embodiment of the present invention leads to saving of main components (comparators) in the ADC. The larger the ADC converter i.e., the higher the number of output digital bits, the greater the saving in comparators. At the limit, the number of comparators utilized by the ADC according to one embodiment of the present invention is $2^N/2$ which is one-half the number of main components required in conventional ADC converters. The embodiment explained in connection with FIG. 4, utilizes a Grey binary 2's complement. This implementation of the output coding does not limit the performance of the ADC.

Figure 6A:
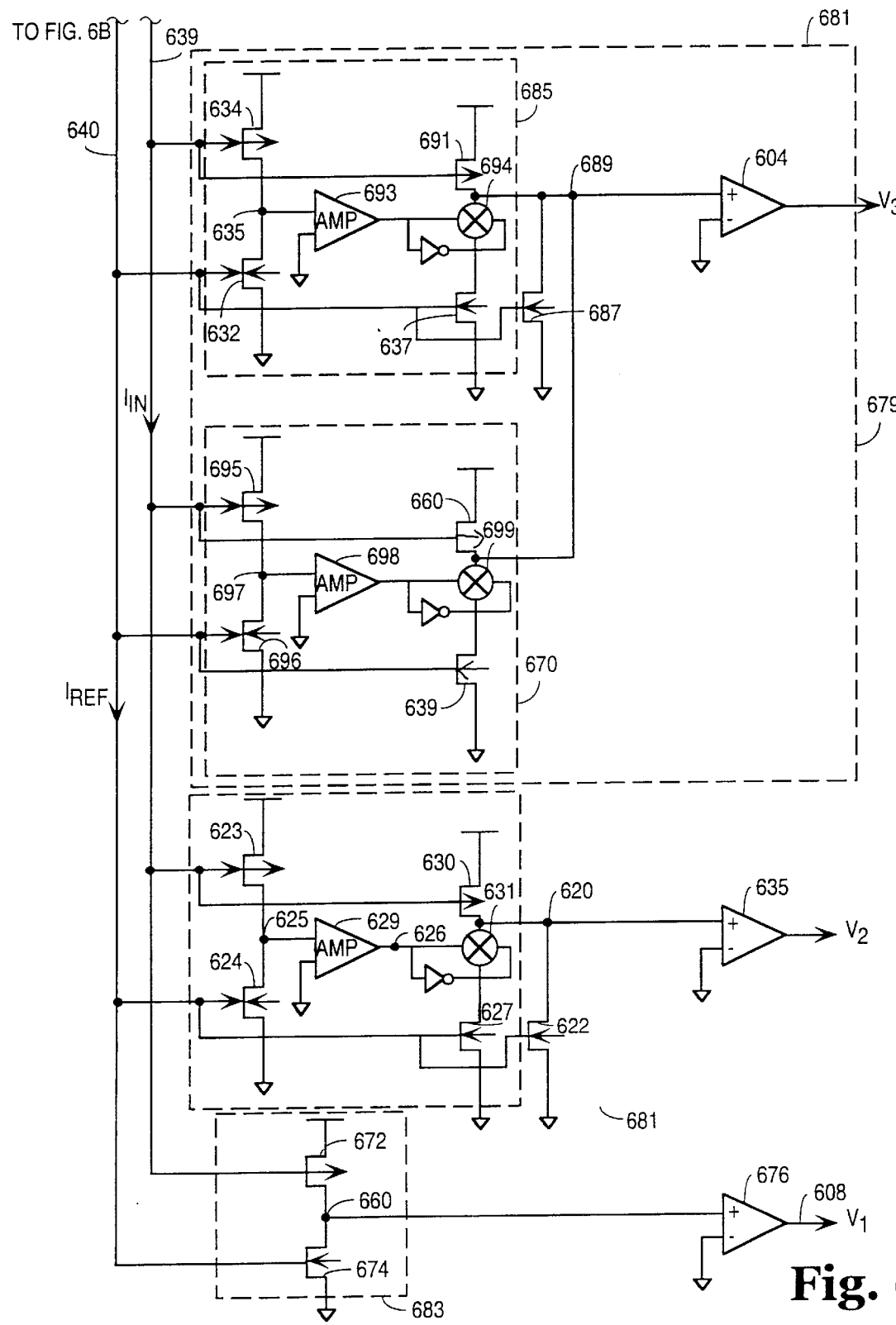
FIGS. 6a–6b are block diagrams that illustrate a detailed diagram of an ADC according to one embodiment of the present invention.
Figure 6B:
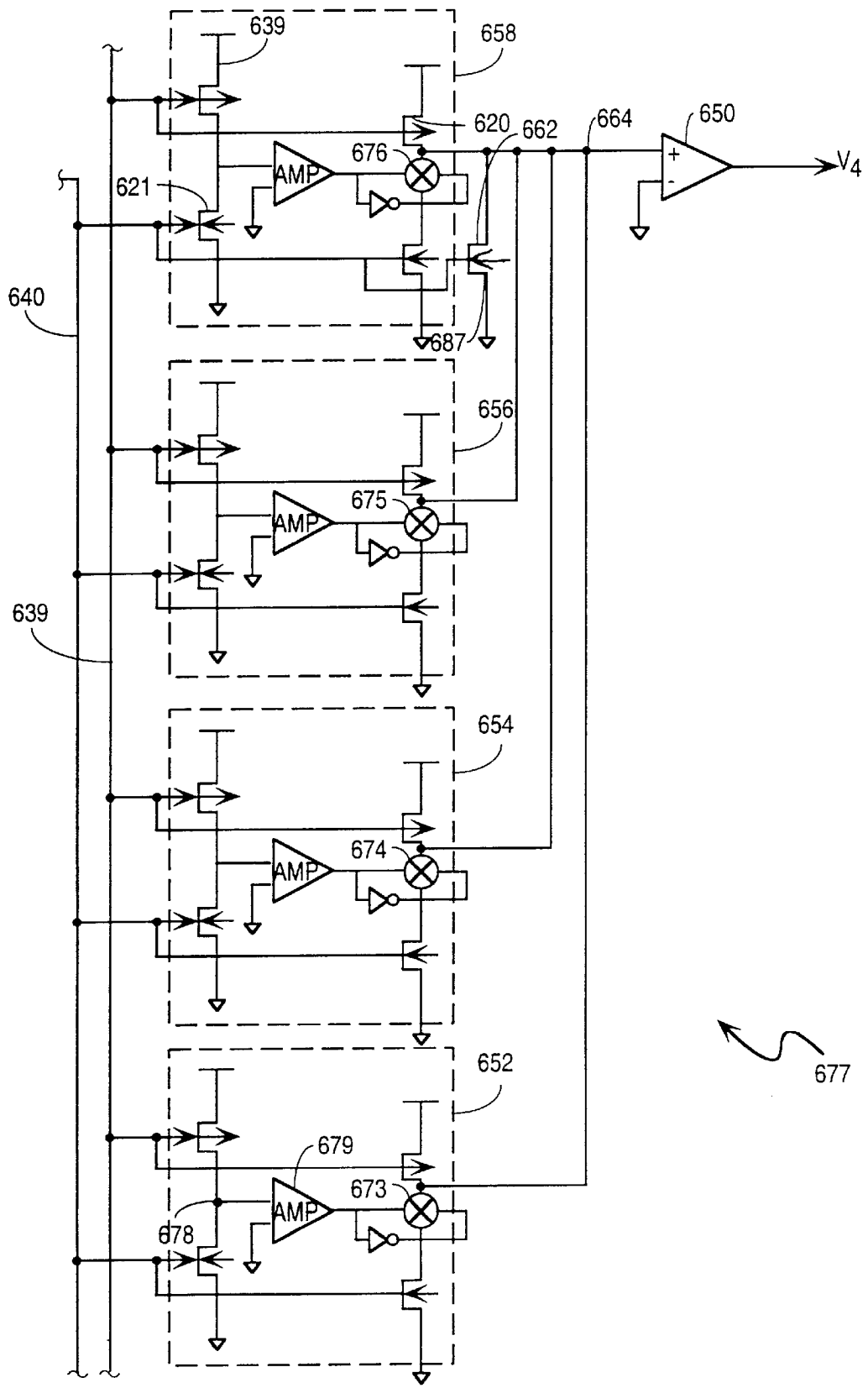

FIGS. 6a and 6b represent a block diagram of a clockless flash ADC electronic circuit 600 that is independent of output coding. The ADC 600 is based on a feedforward perceptron. The ADC 600 consumes less power than conventional neural architectures because it utilizes a reduced number of comparators than conventional neural architectures. As explained earlier in this section, the ADC 600 includes a plurality of N stages that generate a plurality of N digital output bits that comprise the digital representation of the analog input signal to be converted. In one embodiment of the present invention described herein there are 4 stages corresponding to the 4 digital output bits $V_1$, $V_2$, $V_3$ and $V_4$, but the present invention is not limited in scope to a 4-bit ADC. An input current $I_{in}$, proportional to the voltage $V_{in}$ to be converted, flows through current path 639. This current is the current generated by the circuit 200 of FIG. 2. The input current charges the gates the NMOSFET transistors of the four stages 683, 681, 679 and 677 of FIGS. 6a and 6b to a voltage that biases these transistors to cause a current related to $I_{in}$ to flow through these transistor.

A reference current $I_{ref}$ generated as explained in the description connected to FIG. 3, flows through current path 640 to the gates of the PMOSFET transistors, of the 4 stages, to which the current $I_{in}$ is directly applied.

The first stage 683, shown within dotted lines, includes a circuit made up of made up of transistors 672 and 674 acts as a summing device and corresponds to the summing circuit 512 shown in FIG. 5. By way of transistors 672 and 674, the first stage 683 provides at node 660, a first sum of a current related to the input current and of a current related to the reference current. Transistor 674 has a channel with dimensions (W=width and L=length) scaled in a way such that transistor 674 sinks –½ units of current from node 660. In this way, transistors 672 and 674 perform a sum between the value related to the input current $I_{input}$ and –½. If the current through transistor 672 is greater than ½, the sum of the current at node 660 is positive.

When the current through transistor 622 is greater than ½, comparator 676, coupled to node 660, outputs at its output port 608 a logic 1 value for $V_1$. However if the sum of the currents at node 660 is negative, comparator 676 outputs a "0" logic value for $V_1$. Accordingly, first stage 683 provides the output bit $V_1$ in one of first and second logic states, i.e. logic "1" or "0" logic if the sum at node 660 has one of first and second signs, respectively, i.e., a positive sign or a negative sign.

Each of the other three stages of the ADC, according to one embodiment of the present invention, include an output circuit and $2^{(i-2)}$, substages coupled to the output circuit where i is the number of the respective stage. Second stage 681, generates the output bit $V_2$. Second stage includes $2^{(i-2)}$ substages, i.e., one substage 673. Substage 673 is a substage with a configuration that is encountered in the rest of the stages that generate the output bits $V_3$ and $V_4$. Substage 673 includes, among other things, two transistor devices 623 and 624 coupled therebetween. In the embodiment of the present invention described herein, transistors 623 and 624 are implemented by way of NMOSFET and PMOSFET transistors respectively. Transistor 623 is coupled at a gate thereof to path 639 via which the input current $I_{in}$ flows. Transistor 624 is coupled at a gate thereof to path 640 via which the reference current $I_{ref}$ flows. Transistors 623 and 624 are coupled therebetween at summing node 625. The configuration of transistors 623 and 624, coupled as shown in the FIG. 6A, corresponds to summing device 526 of FIG. 5. Transistors 624 and 623 sum up the currents flowing therethrough, which are related to the input current and to the reference current.

When the input current has a value such that transistor 624 is sinking more current from node 625 than transistor 623 is sourcing into node 625, comparator 629 receives at the input thereof a negative value. This value causes comparator 629 to output at an output port 626 thereof a logic 0. In the embodiment of the present invention described herein, as long as the current flowing through transistor 623 is lower than $^{12}/_{16}$, which is equal to ¾, the sum of the currents at summing node 625 is negative. Comparator 629 is coupled at a positive input thereof to node 625 and at a negative input thereof to ground. The negative level at node 626 causes comparator 629 to output at the output port thereof 626 a low voltage value (0 logic). Transistors 623 and 624 and comparator 629 constitute an input circuit.

Substage 673 further includes a hidden circuit 631 coupled to the input circuit i.e., to comparator 629. The hidden circuit, analogous to gate switch 522 of FIG. 5 includes gate switch 631 that is coupled to output port 626 of comparator 629. When the voltage, at the control gate of gate switch 631 is very low or zero, gate 631 is open preventing current flow therethrough.

Substage 673 further includes an output circuit, made up of a summing device including transistors 630 and 622 and of a comparator 635. Comparator 635 is coupled to summing node 620 of the summing device that includes transistors 630 and 622. Transistor 630 is coupled at a gate thereof to current path 639. Transistor 622 is coupled at a gate thereof to reference path 640. The summing device, made up of transistor 630 and 622 corresponds to the summing device 515 illustrated in FIG. 5.

Transistor 622 sinks a fixed current equal to ¼ from node 620. Transistor 630 sources a current related to the input current into node 620. Transistor 622 has the channel's length and width scaled such that a current flowing through this transistor has a value of ¼. When the input current is such that the current sourced by transistor 630 into node 620 is lower than ¼, more current is sunk from node 620 than is sourced into node 620 by transistor 630. This causes comparator 635, analogous to comparator 516 of FIG. 5, to generate a low voltage, "0" logic, at an output port thereof. $V_2$ is therefore set to zero when the current, through transistor 30 is lower than ¼. When the input current is such that the current sourced by transistor 630 is larger than ¼, the overall current at node 620 is positive. This causes comparator 635 to output a logic "1" value at an output port thereof causing $V_2$ to flip to 1.

Transistor 624 has a size of its channel and of its width scaled such that the reference current that charges its gate causes a current having a value of 12/16 to flow therethrough. For values of the input current that cause the current sourced by transistor 623 to be larger than 12/16 the current sourced at node 625 is positive. This causes comparator 629 to output at an output thereof a voltage value high enough to cause switch 631 to close. Closure of switch 631, closes the current path through transistor 627 allowing transistor 627 to pull current from node 620. Transistor 627 has a size such that the current sunk by this transistor from node 620 is ¾. This current is analogous with the −¾ current shown at switch 522 of FIG. 5. Transistor 627 is the device that causes ¾ current to be sunk out of summing device 515 of FIG. 5. As transistor 622 sinks ¼ current out of node 620, the total current sunk from node 620, in this case, is ¾+¼. For values of the current ranging between 12/16 and 16/16, more current is sunk out of node 620 than sourced by transistor 630 into node 620. This causes comparator 634 to generate a 0 logic value at its output port. This is consistent with the table of FIG. 4 that indicates that for values of the current ranging from 12/16 to 16/16, $V_2$ is zero.

The ADC 690 further includes a third stage 679 (shown within dotted lines) that generates the output bit $V_3$. The third stage 681 includes $2^{(3-2)}=2$ substages 670 and 685. Each of these 2 substages work in a substantially same manner as the substage of the second stage 681 explained earlier in this section. Transistor 687 acts much like transistor 622 of the second stage and has the function of sinking a fix current equal to ⅛ out of output node 689. Sinking ⅛ current out of node 689 is analogous to current ⅛ sunk out of the summing device 543 of FIG. 5.

Initially, for input currents having low values, stages 685 and 683 do not sink current from node 689. The only current sunk out of node 689 is ⅛ sunk by transistor 687. The current sunk by transistor 687 is caused by the reference current flowing through path 640, that charges a gate of transistor 687 causing this transistor to conduct current having a value of ⅛. Neither sub-stage 687 nor sub-stage 670 sink current out of node 689 for low values of the input current. Switch gates 694 and 699 are open. Node 689, coupled to transistors 691 and 687, acts like summing device 534 of FIG. 5. Therefore, for currents lower than ⅛, the current sum at summing node 689 is negative such that comparator 692 generates a 0 logic value at the output 604 thereof.

However, when the input current has a value such that the sum of the sourcing currents through transistors 691 and 660 exceeds ⅛, which is the current sunk by transistor 687, a net positive current is sourced into node 689. This causes comparator 692 to generate a logic "1" value to the output port 604 thereof. Note that reference transistor 632 sinks a current having a value of 1/16 out of node 635. When the input current has a value that causes the current through transistor 634 to exceed 9/16, the net value of the current at node 635 is positive. This causes comparator 693 to provide a positive voltage at an output port thereof. This causes transmission gate 694 to close and to conduct current. Consequently, transistor 637 starts sinking a fixed current having a value of ½ from node 689. The value of the current ½ sunk by transistor 637 is obtained by way of designing transistor 637 with specific gate width and length. The effect of transistor 637 is analogous to the effect of the ½ current sunk out of summing device 543 of FIG. 5 when the switch 528 of FIG. 5 closes. The sum of the currents sunk from node 689 is ½+⅛=10/16. This value exceeds the current sourced by transistors 691 and 660. This causes comparator 692 to switch its output to zero logic. When the summing of the currents through transistors 691 and 660 exceeds the value 10/16, the current at node 689 becomes positive again, which causes comparator 692 to flip its output to 1.

In the embodiment of the present invention, described herein, 14/16 is a fixed current value sunk by transistor 696 from node 697. Transistor 696 is the device that causes the value −14/16 to be added by summing device 547 of FIG. 5. When the current through transistor 695 exceeds 14/16, the sum of currents at node 697 is positive. This causes comparator 698 to generate a positive voltage value at an output port thereof. The positive value at the output port of comparator 698 causes gate switch 699 to start conducting. Transistor 639 is designed to sink a current equal to ⅜ out of node 689. The current sunk out of node 689 (⅛+⅜+½=1) is larger than the sum of the currents flowing through transistors 691 and 660. This causes comparator 692 to change its output to zero. Note that gate switch 699 is substantially analogous to the switch 530 illustrated in FIG. 5.

The ADC 600 further includes a fourth stage 677, illustrated in FIG. 6b, that includes 4 substages, 652, 654, 656 and 658. Each substage of the fourth stage 677 operates in substantially the same fashion as the other substages explained in this section. An output circuit of the fourth stage includes comparator 660, comparator 660 and transistor 662. Transistor 662 sinks a current equal to 1/16 at all times. Each substage includes a hidden circuit that is made up of a switch and of a transistor connected to the switch. When the switch is closed, transistor 662 sinks additional current from node 664. Each substage also includes a comparator that has an output port thereof connected to a corresponding gate switch. When the summing device of each substage, made up of the PMOSFET and NMOSFET, generates a positive current at the summing nodes. The comparators coupled to the summing device flip their output ports to a voltage high enough to cause the gate switch coupled thereto to close. The switches 673, 674, 675, and 676, shown in each substage, correspond to switches 587, 542, 544 and 546 shown in FIG. 5.

The substages, illustrated in FIG. 6b, work in substantially the same way as the substages illustrated in the FIG. 6a. For example, the first substage 652 with the gate switch 673 starts sinking more current from node 678 when gate switch 673 closes. Gate switch 673 closes when the input current flowing through current path 639 exceeds the value 3/16. The value 3/16 is the value required for the input current, such that the summing current at the summing node 678 is positive thereby causing comparator 679 to flip to "1" and close gate 673.

The second substage, 654 has its gate switch 674 closed when the input current exceeds 7/16. As the current increases, the substages of fourth stage 677 start sourcing more current out of node 664. The substages 656 and 658 work in a similar fashion as the substages 652 and 654 described above and is the other substages of the rest of the stages described above.

Figure 7:
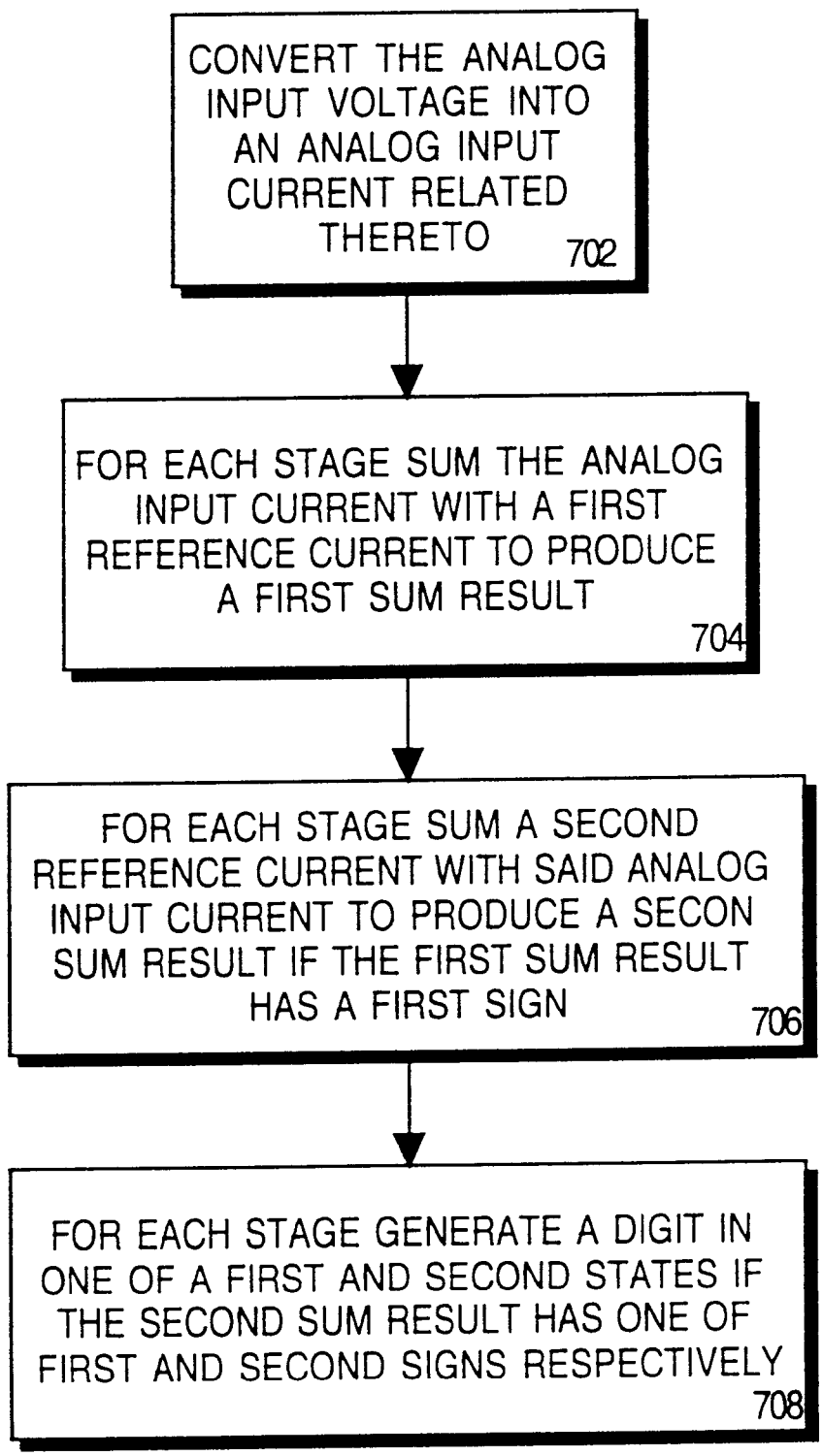
FIG. 7 is a flow chart diagram that illustrates a converting method for an analog voltage into a digital voltage according to one embodiment of the present invention.

In one embodiment, the present invention provides a method of converting an analog voltage into digital voltage that has N digits. FIG. 7 is a flow chart diagram that illustrates the method of converting an analog voltage into digital voltage that has N digits. At block 702 an analog input voltage is converted in an analog input current related thereto. At block 704, for each digit of the N digits, the analog input current is summed with a first reference current to produce a first sum result. At block 706, for each digit of the N digits, a second reference current is summed with the analog input current to produce a second sum result if the first sum result has a first sign. A digit in one of a first and second state is generated if, the second sum result has one of first and second signs respectively.

In the previous detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A flash analog-to-digital converter (ADC) comprising:
   a plurality of N stages, to provide N digital signals, including first stage to provide a sum of an input current, related to a voltage to be converted, and of a reference current and to provide a first digital signal in one of first and second states if said first sum has one of first and second signs respectively, and
   i stages, with i=2 . . . N, each stage i including an output circuit and $2^{(i-2)}$ sub-stages coupled to said output circuit, each sub-stage including input and hidden circuit coupled therebetween, said input circuit configured to provide a first sum of said input current and of a first reference current, each hidden circuit providing to said output to circuit a second reference current when said first sum has a first sign, said output circuit generating an i-th digital signal in one of a first and second states when a second sum of said input current and of said second reference current has one of first and second signs respectively.

2. The ADC of claim 1 wherein said first stage includes a comparator to receive said sum and to provide said a digital signal in one of first and second states if said sum has one of first and second signs respectively.

3. The ADC of claim 1 wherein said first stage further includes a summing device to sum said input current with said reference current.

4. The ADC of claim 3 wherein said summing device includes first and second Metal Oxide Semiconductor Field Effect Transistors (MOSFET) coupled therebetween.

5. The ADC of claim 1 wherein each input circuit includes a comparator to receive said first sum and provide to said hidden circuit a control signal that has one of first and second states if said first sum has one of first and second signs respectively.

6. The ADC of claim 1 wherein said hidden circuit includes a switch to receive said control signal and switch to one of first and second positions if said control signal is in one of said first and second states.

7. The ADC of claim 6 wherein said hidden circuit further includes a sinking circuit to sink said second reference current when said switch is switched in said first position.

8. The ADC of claim 1 wherein said output circuit includes a summing device to provide a sum of said input current, of said second reference current and of a third reference current.

9. The ADC of claim 8 wherein said output circuit further includes a comparator circuit coupled to said summing device to receive said sum of said input current, of said second reference current and of a third reference current and to generate a digital signal.

10. The ADC of claim 1 further including a voltage-to-current converter that utilizes an external precision resistive element.

11. A flash analog to digital converter (ADC) comprising:
    a plurality of N circuits, to provide N digital signals, including:
       first circuit including first and second transistors having their gates coupled to an input current and to a first reference current respectively, to provide a sum of said input current, related to a voltage to be converted, and of a first reference current and to provide a first digital signal in one of first and second states if said sum has one of first and second signs respectively; and
       i circuits, with i=2–N, each circuit i including an output circuit and $2^{(i-2)}$ sub-circuits coupled to said output circuit, each sub-circuit including input and hidden circuits coupled thereto, said input circuit configured to provide a first sum of said input current and of a first reference current, each hidden circuit providing to said output circuit a second reference current when said first sum has a first sign, said output circuit generating an i-th digital signal in one of a first and second states if a second sum of said input current and of said second reference current has one of first and second signs respectively, each of said input circuits including first and second transistors that have first and second gates respectively coupled to said input and said first reference currents, said input circuit further having a first comparator to receive at an input thereof a current difference related to a difference between said input current and said first reference current, each hidden circuit including a switch gate having a control gate coupled to an output of said first comparator.

12. The ADC of claim 11, further including a voltage-to-current converter that has an external precision resistor to adjust precision of said ADC.

13. The ADC of claim 11 wherein said first stage includes a comparator to receive said sum and to provide said first digital signal in one of first and second states if said sum has one of first and second signs respectively.

14. The ADC of claim 11 wherein said first stage further includes a summing device to sum said input current with said reference current.

15. The ADC of claim 14 wherein said summing device includes first and second Metal Oxide Semiconductor Field Effect Transistors (MOSFET) coupled therebetween.

16. The ADC of claim 11 wherein each input circuit includes a comparator to receive said first sum and provide to said hidden circuit a control signal that has one of first and second states if said first sum has one of first and second signs respectively.

17. The ADC of claim 11 wherein said hidden circuit includes a switch to receive said control signal and switch to one of first and second positions if said control signal is in one of said first and second states.

18. The ADC of claim 17 wherein said hidden circuit further includes a sinking circuit to sink said second reference current when said switch is switched to said first position.

19. The ADC of claim 11 wherein said output circuit includes a summing device to provide a sum of said input current, of said second reference current, and of a third reference current.

20. A method to convert an analog voltage into a digital voltage that defines N digital signals of N stages, the method comprising:

(i) setting $i_0=0$, wherein $i_0$ represents an increment value;

(ii) setting $i=i_0+1$, wherein i represents the number of the stage;

(iii) if $2^{(i-2)} \geq 1$, then (a) presenting $2^{(i-2)}$ input layer comparators as i stage comparators, each i stage input layer comparator coupled at an input to an i stage input layer summing device and at an output to an i stage hidden layer gate switch, each i stage hidden layer gate switch coupled in series between the input current and an output layer i summing device, (b) presenting in each i stage input layer summing device the input current, (c) presenting in each i stage input layer summing device the reference current, (d) summing at each i stage input layer summing device the input current and the reference current to produce at each i stage input layer summing device an i stage input layer sum having one of a first sign and a second sign, (e) producing from each i stage input layer comparator a digital signal as a function of the sign of an associated i stage input layer sum, and (f) comparing each digital signal to the input current at an associated hidden layer gate switch to output an input current that is related to the analog voltage;

(iv) presenting in an i stage output layer summing device an input current that is related to the analog voltage;

(v) presenting in the i stage output layer summing device a reference current;

(vi) summing in the i stage output layer summing device the input current and the reference current to produce an i stage output layer sum having one of a first sign and a second sign;

(vii) producing from an i stage output layer comparator coupled to the i stage output layer summing device a $V_i$ digital signal as a function of the sign of the i stage output layer sum;

(viii) setting $z=N-i$, wherein z is an incremental value;

(ix) setting $i_0=i_0+1$; and (x) if $z>0$, repeating steps (ii) through (ix).

21. The method of claim 20 wherein N is a multiple of 2.

22. The method of claim 20, wherein presenting an input current that is related to the analog voltage includes passing the analog voltage through a voltage-to-converter circuit having a resistor whose accuracy is at least 1%.

23. A N-bit flash analog-to-digital converter, comprising:

a plurality of N-stages including a most significant stage and (N−1) less significant bit stages, wherein the plurality of stages includes less than $2^N$ comparators;

the most significant bit stage includes a first stage with a first summing device coupled to a comparator, wherein the summing device includes an analog input current port and a reference current input port, and the comparator includes a most significant bit output port;

the (N−1) less significant bit stages each include a second stage which includes a second summing device coupled to a second comparator, wherein the second summing device includes a reference current input port and the second comparator includes a less significant bit output port, wherein the second summing device is coupled to an output of a series of at least one, dependent on bit significance of the stage, gate switches, wherein the series of gate switches includes the analog current input port as a first input and is coupled to a third comparator at a second input, and wherein a third summing device is coupled between the third comparator and the analog current input port.

24. The converter of claim 23 wherein the gate switches are arranged to yield an N-bit converted value that is in Gray code.

* * * * *

UNITED STATES PATENT AND TRADEMARK OFFICE
CERTIFICATE OF CORRECTION

PATENT NO. : 6,198,421 B1  Page 1 of 1
DATED : March 6, 2001
INVENTOR(S) : Doyle et al.

It is certified that error appears in the above-identified patent and that said Letters Patent is hereby corrected as shown below:

<u>Title page,</u>
Item [73], delete "Intle" and insert -- Intel --.

Signed and Sealed this

Fourth Day of March, 2003

Attest:

Attesting Officer

JAMES E. ROGAN
*Director of the United States Patent and Trademark Office*